United States Patent [19]

Horiike et al.

[11] 4,277,304
[45] Jul. 7, 1981

[54] ION SOURCE AND ION ETCHING PROCESS

[75] Inventors: Yasuhiro Horiike, Tokyo; Haruo Okano, Yokohama; Masahiro Shibagaki, Hiratsuka; Katsuo Kadono, Yokosuka, all of Japan

[73] Assignee: Tokyo Shibaura Denki Kabushiki Kaisha, Kawasaki, Japan

[21] Appl. No.: 87,041

[22] Filed: Oct. 22, 1979

[30] Foreign Application Priority Data

Nov. 1, 1978 [JP] Japan ................... 53-133718

[51] Int. Cl.³ ............... H01L 21/306; H01J 17/04
[52] U.S. Cl. .................. 156/643; 156/345; 156/646; 204/192 E; 204/298; 250/530; 313/161; 313/231.3; 313/293
[58] Field of Search ............... 156/643, 646, 345; 204/164, 192 E, 192 N, 284, 298; 250/423 R, 424, 530, 531; 313/217, 161, 231.3, 293; 315/338, 344

[56] References Cited

FOREIGN PATENT DOCUMENTS 53-106655 8/1978 Japan .

OTHER PUBLICATIONS

Proceedings on the Symposium on Ion Sources and Application Technology, The Institute of Electrical Engineers of Japan, Feb. 14 and 15, 1977, "Development of Magnetron Ion Source," by Kazuyuki Toki, pp. 57-58.

Primary Examiner—William A. Powell
Attorney, Agent, or Firm—Oblon, Fisher, Spivak, McClelland & Maier

[57] ABSTRACT

An ion source suitably used for an etching process among manufacturing processes for e.g. semiconductor devices, comprising a vacuum container, an anode disposed in the vacuum container, a cathode having one or more looped slits formed opposite said anode, and one or more permanent magnets located in a position or positions corresponding to a portion of the cathode surrounded by the looped slit or slits and forming a magnetic field having a direction at substantially right angles to the direction of an electric field formed by applying a voltage between the anode and cathode, a gas which is introduced into the vacuum container through an inlet means formed in the vacuum container being made into gas plasma by means of the electric and magnetic fields at right angles to each other, whereby positive ions in the gas plasma will be taken out through the looped slit or slits.

9 Claims, 12 Drawing Figures

ION SOURCE AND ION ETCHING PROCESS

BACKGROUND OF THE INVENTION

This invention relates to ion etching, more specifically to an ion source and an ion etching process effectively used for the etching of semiconductor devices.

Recently, the method for etching patterns of semiconductor integrated circuits has been being switching from the wet process utilizing chemical solutions to the dry process such as plasma etching. This is attributable to the fact that the dry process surpasses the wet process in some points; improved accuracy, simplicity of processing stages achieved by automation, pollution-free processing without producing waste fluid, etc.

Figure 1:
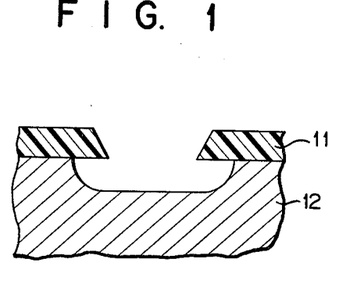
FIG. 1 is a sectional view showing an etching shape obtained after plasma etching.
Figure 2:
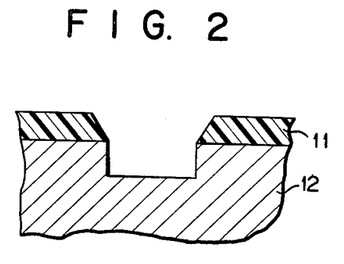
FIG. 2 is a sectional view showing an etching shape obtained after ion etching.

For the dry etching process, there are known sputtering etching and ion etching, besides the plasma etching. The plasma etching among these processes, which is performed in plasma obtained by impressing high frequency to a gas such as fluorocarbon, is not directional but isotropic, so that an undercutting will be formed under a mask in the same manner as the case of the wet etching process (FIG. 1 shows an undercutting). Owing to such undercutting, the plasma etching can provide only a pattern with a thickness of about 4 $\mu$m, so that it can hardly be applied to the manufacture of ultra LSI's which requires superfine processing to provide a pattern width of 1 to 2 $\mu$m.

In the sputtering etching, on the other hand, gas plasma is produced by means of high frequency, and a workpiece to be etched, which has previously been cooled, is disposed on the cathode side, and etched by sputtering ions that are accelerated by cathode drop voltage. According to the sputtering etching, therefore, reactive ions run against the workpiece with directivity, thereby improving the undercutting of the mask. In this case, however, the etching mask touches an atmosphere of gas plasma, so that it will be retreated during the etching process, and hence the etching pattern will be forced to extend.

The ion etching may be regarded as a dry etching process that obviates the above-mentioned defects of the plasma etching and sputtering etching. According to the ion etching process, a thin gas at a pressure of e.g. $10^{-4}$ torr is made into plasma, and etching is performed by means of reactive ions that alone are taken out of the plasma. The mean free path of the reactive ions is wide enough to prevent the undercutting of the mask, and the mask will not be retreated because the to-be-etched workpiece is kept from the gas plasma. Thus, the ion etching may be regarded as highly effective for the superfine processing of semiconductor devices.

Figure 3:
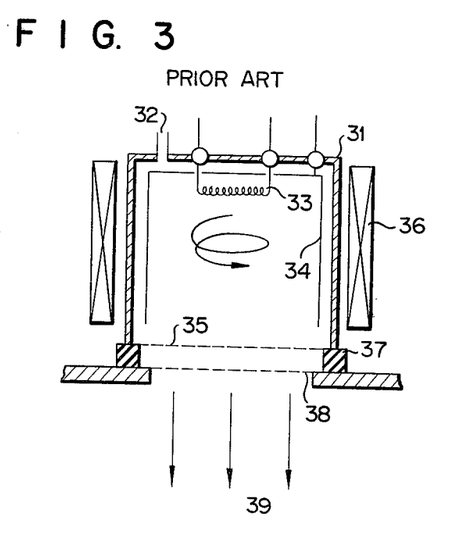
FIG. 3 is a side sectional view of a prior art ion impulse type ion source.

FIG. 3 shows a prior art electron impulse type (Koufman type) ion source incorporated in an apparatus for such ion etching. This ion source consists of a vacuum container 31, a filament 33 and a cylindrical anode 34 of e.g. aluminum disposed in the vacuum container 31, a grid 35 of e.g. molybdenum disposed opposite to the filament 33, a mesh-like cathode 38 facing the grid 35 with an insulating member 37 between, and a coaxial coil 36 surrounding the vacuum container 31. The operating principle of the ion source is as follows. Heat electrons emitted from the filament 33 move toward the grid 35 in accordance with a voltage of e.g. hundreds of volts which is applied between the cylindrical anode 34 and the grid 35. At the same time, the heat electrons are subjected to the action of a magnetic field created by the coaxial coil 36, after all moving in a cycloid. Then, the heat electrons run against gas molecules of a gas to be made into plasma at a pressure of approximately $10^{-4}$ torr that is introduced through a gas inlet 32 in the vacuum container 31, thereby forming gas plasma. Positive ions out of the gas plasma are extracted and accelerated by the mesh-like cathode 38 to form an ion beam 39. With such ion source, there may be provided a large beam diameter, as well as a large current flow. Presently, Koufman type ion souces with a diameter of 10 inches are being developed.

However, the tungsten filament or heat cathode, which is used with the above-mentioned ion source, is etched to be cut or broken by introduced reactive gases, such as $CF_4$, $C_2F_6$, $C_3F_8$, $CHF_3$, $SiF_4$, etc., in a few minutes to tens of minutes, thereby interrupting electric discharge. Thus, the ion source of this type has only too short a life to be industrially applied to the etching process for semiconductor devices.

Figure 4A:
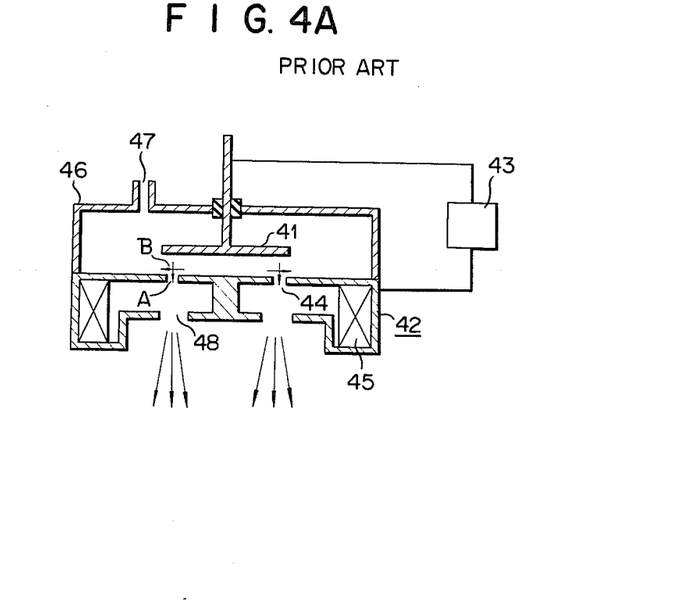
FIG. 4A is a side sectional view of a prior art magnetron type ion source.
Figure 4B:
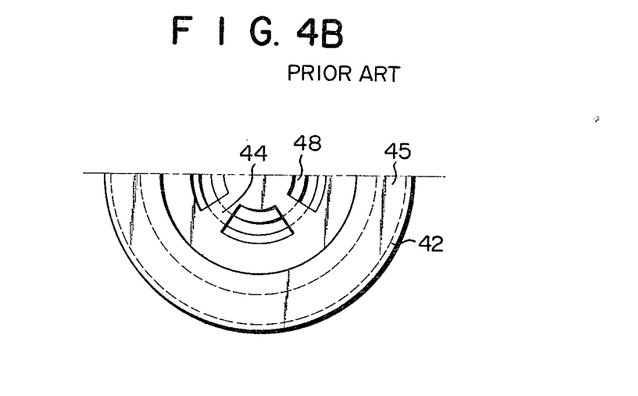
FIG. 4B is a plan of a cathode of the ion source of FIG. 4A.

As an improved version of such heat cathode type ion source, there has recently been developed a magnetron type ion source having no electron emitting means and utilizing space charges. FIGS. 4A and 4B show an outline of such ion source. In this ion source, a flat anode 41 of e.g. stainless steel and a box-type cathode 42 of e.g. mild steel are disposed opposite to each other. When a voltage is applied to both these electrodes by an external direct current power source, an electric field is formed between them. A circular slit 44 is cut in a side of the cathode 42 that faces the anode 41. The direction of the electric field in the vicinity of the slit 44 is indicated by arrow A. Inside the box-type cathode 42, on the other hand, there is disposed a coaxial coil 45. The direction of a magnetic field created by the coil 45, in the vicinity of the slit 44, is indicated by arrow B. Namely, an orthogonal electromagnetic field is formed in a closed loop near the circular slit 44, and the electrons, which exist as the spaced charges from the beginning, circulate along the closed loop. Hereupon, when a gas to be made into plasma is introduced through a gas inlet 47 of a vacuum container 46, the gas molecules run against the circulating electrons to form gas plasma. An opening 48 for ion exhaust is bored through the bottom of the box-type cathode 42, and positive ions in the gas plasma are accelerated and drawn out to the exterior through the opening 48 by the electric field.

Utilizing no filament, the ion source of this type involves no problem as regards the life span, despite the use of the reactive gases, though it still is subject to the following defects:

(1) The use of an electric magnet requires a large housing space, thereby making the apparatus unreasonably large-sized.

(2) The electric magnet requires a power source for its exclusive use.

(3) Since the coaxial coil cannot help being disposed around the looped slit, most of the magnetic energy is consumed outside the coil, making it difficult to obtain an intensive magnetic field in the vicinity of the looped slit.

(4) It is hard to discharge water and gas sticking to the coil surface, and it takes a long time to improve the degree of vacuum.

SUMMARY OF THE INVENTION

The object of this invention is to provide an ion source of simple construction capable of miniaturization and effective use of magnetic field and suitably built in an etching apparatus and the like.

According to this invention, there is provided an ion source which comprises a vacuum container, an anode disposed in the vacuum container, a cathode having one or more looped slits formed opposite said anode, and one or more permanent magnets located in a position or positions corresponding to a portion of the cathode surrounded by the looped slit or slits and forming a magnetic field having a direction at substantially right angles to the direction of an electric field formed by applying a voltage between the anode and cathode, a gas which is introduced into the vacuum container through an inlet means formed in the vacuum container being made into gas plasma by means of the electric and magnetic fields at right angles to each other, whereby positive ions in the gas plasma will be taken out through the looped slit or slits.

DETAILED DESCRIPTION OF THE PREFERRED EMBODIMENTS

Referring now to the drawings of FIGS. 5 and 6, there will be described an ion source according to an embodiment of this invention which is applied to an ion etching apparatus.

Figure 5:
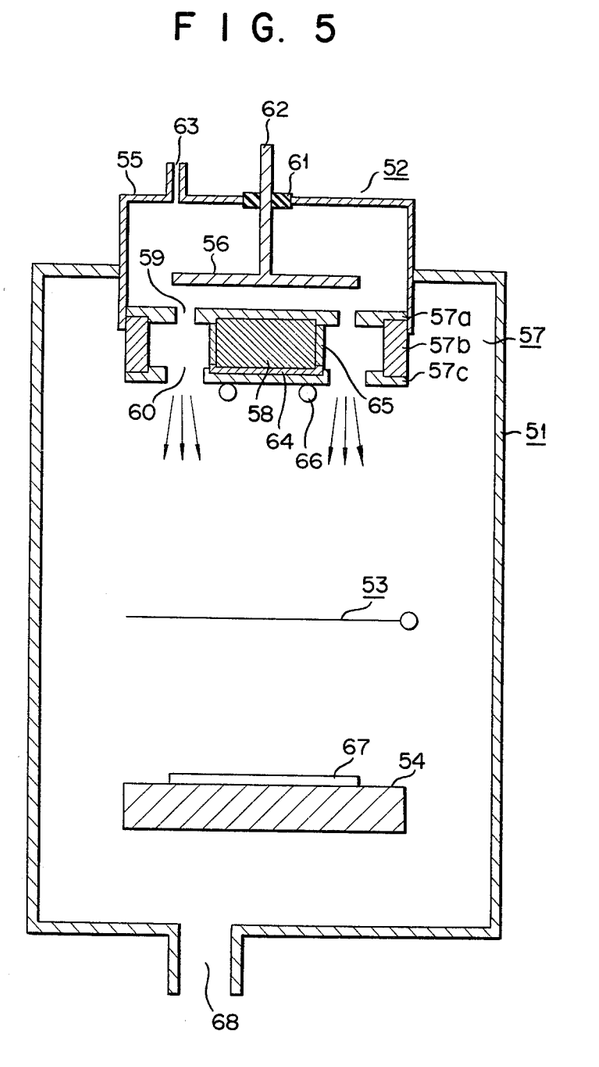
FIG. 5 is a side sectional view of an etching apparatus provided with an ion source according to an embodiment of this invention.
Figure 6:
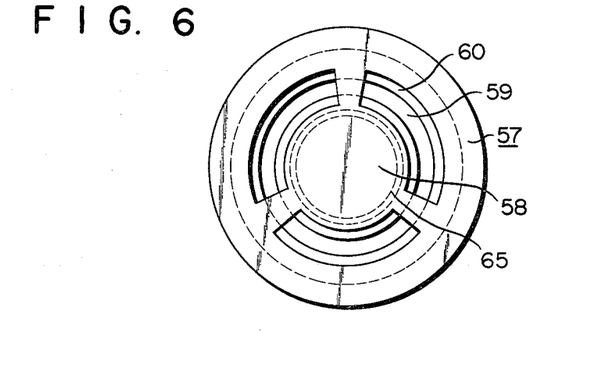
FIG. 6 is a plan of a cathode of the ion source of FIG. 5.

FIG. 5 is a side sectional view of the ion etching apparatus with the ion source of the invention, and FIG. 6 is a plan of a cathode of the ion source of FIG. 5 as viewed from under. First, there will be described the construction of the ion etching apparatus. A main body 51 of the ion etching apparatus contains therein an ion source 52, a shutter mechanism 53, and a sample support 54. The ion source 52 disposed at the top portion of the main body 51 is formed of a cylindrical container 55 which contains therein a flat-plate-type anode 56 of e.g. aluminum and a box-type cathode 57 made of a magnetic material such as mild steel facing the anode 56 at a space of e.g. 9 mm therefrom. The box-type cathode 57 is composed of an upper cover 57a, a side wall 57b, and a lower cover 57c. In the center of the interior of the box-type cathode 57 lies e.g. a cylindrical Co-Sm based rare earth metal magnet 58 (45-mm diameter, 10-mm thickness). In the upper cover 57a of the box-type cathode 57, there is bored a circular slit 59 with a width of 2 mm and coaxial with the permanent magnet 58. On the other hand, an ion exhaust ports 60 are cut in the lower cover 57c. The flat-plate-type anode 56 is electrically connected with an anode terminal 62 which is led to the outside through an insulating member 61, while the box-type cathode 57 is caused to electrically connect with the cylindrical container 55. A gas inlet port 63 is formed in the top of the cylindrical container 55 which constitutes the ion source 52.

Interposed between the permanent magnet 58 and the lower cover 57c is a spacer 64 of a magnetic material such as e.g. mild steel for the protection of the permanent magnet 58. Moreover, a radiator plate 65 of e.g. aluminum surrounds the permanent magnet 58, and a cooling pipe 66 is attached to the bottom of the lower cover 57c, both members preventing reduction of magnetic force due to a temperature rise of the permanent magnet 58.

At the lower portion of the ion source 52, there are an optional accelerating grid (not shown), a shutter mechanism 53, and a sample support 54 carrying a workpiece 67 to be etched. Further, a gas outlet port 68 coupled to a vacuum pump (not shown) is formed at the bottom of the main body 51.

Although in the ion source of FIG. 5 the circular looped slit 59 is cut in the upper cover 57a of the box-type cathode, this invention is not limited to such construction. The slit may be formed alternatively in the lower cover 57c. If the slit is cut in the lower cover 57c, however, a gas inlet port is formed in the upper cover 57a, and, for example, a doughnut-shaped anode is disposed inside the box-type cathode 57.

No matter whether the circular looped slit 59 is cut in the upper cover 57a or in the lower cover 57c, the magnetic circuit formed in the box type cathode 57 has only one air gap, i.e. the slit 59. The magnetic field generated by the circuit is most intense in the vicinity of the slit 59. In the embodiment of FIG. 5 the ion exhaust ports 60 do not form a circular looped slit. They are provided separately, arranged on the same circle. In these ports 60 the magnetic field is weak.

Now there will be described an ion etching process employing the ion etching apparatus with the ion source constructed as aforesaid. First, the vacuum pump (not shown) is operated to exhaust the residual gas in the main body 51 through the exhaust port 68, thereby creating a vacuum in the apparatus. Subsequently, a gas to be made into plasma, such as $C_2F_6$, at a pressure of $5\times10^{-3}$ to $1\times10^{-5}$ torr is introduced through the gas inlet port 63, and then a voltage of e.g. 1,000 V is applied between the anode terminal 62 and the cylindrical container 55 which is grounded, for example. By such impression of voltage, a downward electric field is formed in the vicinity of the circular slit 59 cut in the upper cover 57a. Also in the vicinity of the circular slit 59, an intensive radial magnetic field (e.g. 6,000 G) is created by the permanent magnet. This is done because the box-type cathode 57 forms a magnetic circuit. Accordingly, an orthogonal electromagnetic field is formed in a closed loop along the circular slit 59. In this orthogonal electromagnetic field circulate electrons as space charges. The gas to be made into plasma, which is introduced into the cylindrical container 55, runs against the circulating space charges to be dissociated, thereby producing plasma. The inventors hereof noticed circular plasma emitting light near the circular slit 59. On the other hand, a voltage is applied between the anode 56 and the cathode 57, so that positive ions in the plasma are exhausted through the ion exhaust ports 60 cut in the lower cover 57c to form an ion beam. After the ion beam is stabilized, the shutter mechanism 53 is opened to cause the ion beam to strike against the workpiece 67 on the sample support 54, thereby allowing the workpiece 67 to be etched.

With the etching apparatus and etching process as described above, an ion beam current out of a current (plasma current) of 18 mA flowing between the anode 56 and cathode 57 was found to be 9 mA to substantiate a conversion efficiency of 50% when the apparatus was operated under operating conditions given as follows: 2 mm for the width of the circular slit 59, 9 mm for the distance between the anode 56 and cathode 57, 1,000 V for the voltage applied, $C_2F_6$ gas for the introduced gas, $8 \times 10^{-4}$ torr for the pressure inside the container 55, and $5 \times 10^{-4}$ torr for the pressure inside the main body 51. The obtained value of the conversion efficiency can be regarded as extremely high as compared with the value for the magnetron type ion source of FIG. 4 which proved to be at most 10% or thereabout. This suggests that the use of the ion source of this invention will enable us to perform effective etching. When Si and $SiO_2$ were etched under the aforesaid operating conditions, the etching rates for Si and $SiO_2$ proved to be 70 Å/min and 800 Å/min, respectively.

According to the ion source of this invention, there may be obtained so high conversion efficiency as described above, and the permanent magnet 58 is disposed in the center of the interior of the box-type cathode 57. Therefore, the resistance in the magnetic circuit formed of the box-type cathode 57, as well as the quantity of mild steel required for the cathode serving also as the magnetic circuit, may be reduced, leading to a saving of resources and miniaturization of the ion source. Moreover, the magnetic energy may be utilized effectively without involving any leakage to the outside.

Furthermore, according to the ion source of this invention, a permanent magnet is employed instead of using an electric magnet, so that there will be no need for an electric source, and that the price may be reduced to lower than 1/20 of that of the prior art magnetron type ion source. By variously changing the shape and arrangement of the permanent magnet, in particular, a wide variety of ion sources may be manufactured. Various changes and modifications of the ion source may be effected in order to obtain uniform distribution of ions which are emitted from the ion source and introduced into the main body of the etching apparatus or to process many workpieces to be etched.

Figure 7A:
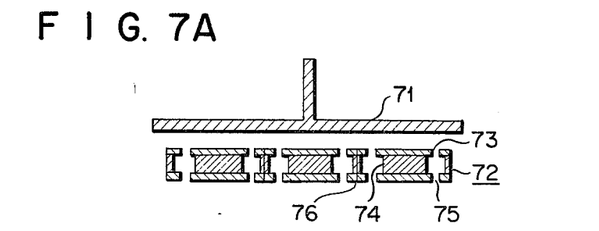
FIG. 7A is a side sectional view of an ion source according to another embodiment of this invention.
Figure 7B:
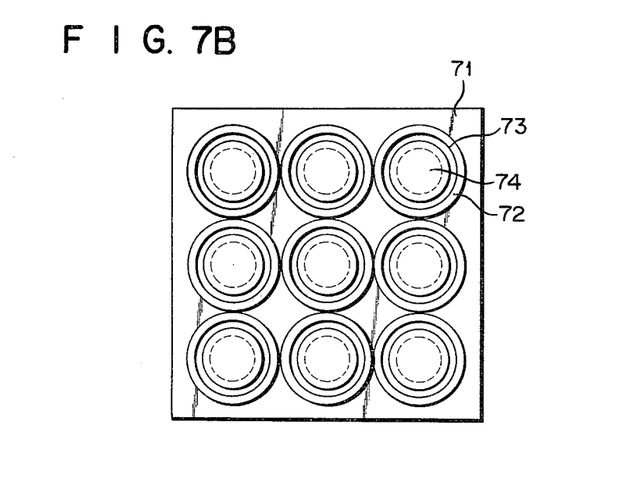
FIG. 7B is a plan of a cathode of the ion source of FIG. 7A.

FIG. 7A is a side sectional view showing an example of an ion source for processing a number of workpieces to be etched, which, provided with a plurality of permanent magnets, is able to provide uniformly distributed ions. FIG. 7B is a plan view of FIG. 7A and viewed from under. In FIGS. 7A and 7B, a plurality of box-type cathodes 72 is disposed opposite a single rectangular flat anode 71. A plurality box-type cathode may be integrally or separately constructed. A plurality of circular slits 73 are arranged on the top of the box-type cathodes 72, while a plurality of ion exhaust ports 75 are formed in the bottom coaxially with their corresponding circular slits 73. The ion exhaust ports 75 do not form a circular looped slit. The bridges (not shown) are thrown across the slit of the ion exhaust ports 75. The box-type cathodes 72 are divided by a plurality of partition walls 76. Small disklike permanent magnets 74 are contained in their corresponding compartments separated by the walls 76. Such arrangement will be able to improve the uniformity of the ion beams exhausted through the ion exhaust port 75. Moreover, the cathode of such construction will never cause interactions between the permanent magnets.

Figure 8A:
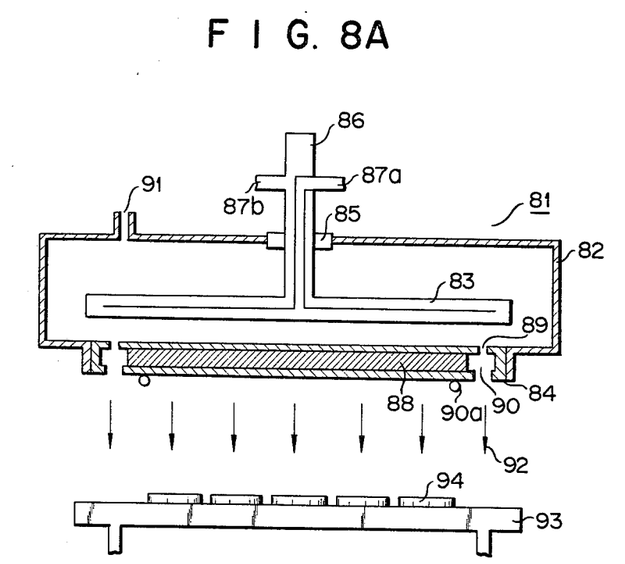
FIG. 8A is a side sectional view of an ion source according to still another embodiment of this invention.
Figure 8B:
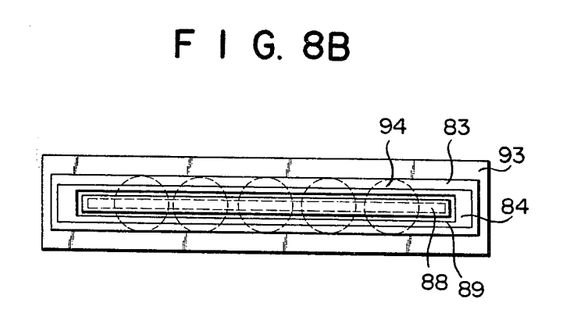
FIG. 8B is a plan of a cathode of the ion source of FIG. 8A.

As mentioned before, one of the features of this invention lies in that the orthogonal electromagnetic field forms a closed loop. Accordingly, it is possible to form ion beams of various shapes coaxial with and similar to the permanent magnets by variedly selecting the shapes of the permanent magnets while keeping the aforesaid feature. For example, FIGS. 8A and 8B are a side sectional view and a plan of an ion source using a rectangular permanent magnet, respectively. In FIGS. 8A and 8B, an ion source 81 includes a vacuum container 82 in which a flat anode 83 and a box-type cathode 84 are disposed opposite to each other. One end of the flat anode 83 is led to the outside through an insulating member 85, forming an anode terminal 86. Inside the flat anode 83 and the anode terminal 86, a cooling conduit extends between nozzles 87a and 87b. A rectangular permanent magnet 88 is contained in the box-type cathode 84, while a rectangular loop-like slit 89 near which an orthogonal electromagnetic field is formed is cut in an upper cover of the cathode 84, and an ion exhaust ports 90 are cut separately in parallel with the slit 89, in a lower cover of the cathode 84. Also, the lower cover of the cathode 84 is fitted with a cooling pipe 90a for cooling the permanent magnet 88.

In thus constructed ion source of FIGS. 8A and 8B, a gas introduced through a gas inlet 91 which is formed in the vacuum container 82 is caused to run against space charges circulating through the orthogonal electromagnetic field, which is formed in the vicinity of the rectangular loop-like slit 89, to form plasma when a voltage is supplied between the anode 83 and cathode 84, and an ion beam 92 is exhausted through the ion exhaust ports 90. The ion beam 92 is passed through an accelerating grid (not shown) and a shutter mechanism (not shown), and is applied onto workpieces to be etched, e.g. wafers 94, that are placed on a sample support 93 through which a cooling conduit passes. In this case, the shape of the ion beam 92 is rectangular looplike, so that a plurality of wafers 94 can be etched uniformly at a time by moving the sample support 93 carrying the wafers 94 at right angles to the plane of the drawing. Moreover, in order further to improve the etching efficiency, a plurality of such rectangular permanent magnets may be arranged in rows.

In the ion source of this invention, as described above, the permanent magnets and the loop-like slits formed in the cathode are arranged coaxially with and similar to one another so that the orthogonal electromagnetic field may be formed in the vicinity of the loop-like slits. With the ion source employing the prior art etching coil, however, it is hard to form the coil into other shapes than circularity, and moreover it is very difficult to make such a coil that a uniform magnetic field may be formed near the looped slits.

Figure 9:
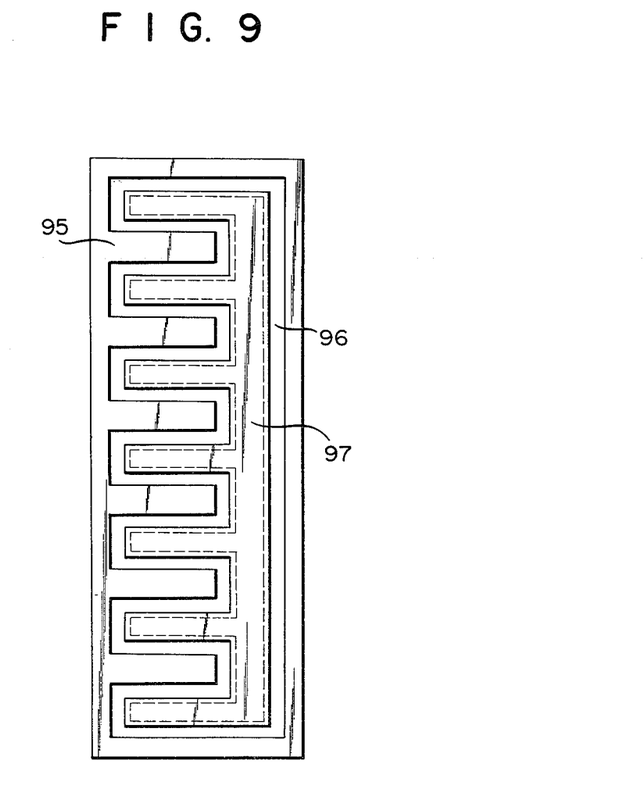
FIG. 9 is a plan of a cathode of an ion source according to a further embodiment of this invention.

According to this invention, moreover, a labyrinthine loop-like ion beam may be obtained by using an anode of such construction as shown in FIG. 9. In this arrangement, a labyrinthine looped slit 96 is formed in an upper cover of a box-type cathode 95, and a permanent magnet of a shape corresponding to the labyrinthine looped slit 96 is disposed inside the box-type cathode 95, as indicated by the chain line. An ion source with such cathode will exhibit higher efficiency in providing a uniform ion beam.

Available gases for the ion etching by means of the ion source of this invention include not only those which contain fluorine atoms, such as $C_2F_6$ and $CF_4$, but also those which contains other halogen atoms such as chlorine and bromine. The use of $CCl_4$ gas, in particular, enables efficient etching of aluminum which is essential to the manufacture of integrated circuits.

Although there have been described herein cases where the ion source of this invention is applied to ion etching, it can be used also as an ion source for ion implantation.

What we claim is:

1. An ion source comprising:
   a vacuum container;
   an anode disposed in said vacuum container;
   a cathode having one or more looped slits formed opposite said anode; and
   one or more permanent magnets located in a position or positions corresponding to a portion of said cathode surrounded by said looped slit or slits and forming a magnetic field having a direction at substantially right angles to the direction of an electric field formed by applying a voltage between said anode and cathode;
   a gas which is introduced into said vacuum container through an inlet means formed in said vacuum container being made into gas plasma by means of said electric and magnetic fields at right angles to each other, whereby positive ions in said gas plasma will be taken out through said looped slit or slits.

2. An ion source according to claim 1, wherein said cathode is formed of a magnetic material and forms, together with said permanent magnet, a magnetic circuit.

3. An ion source according to claim 1 or 2, wherein said cathode has a box-type structure formed of upper and lower covers and side walls, said upper cover having said looped slit formed therein, and said lower cover having ion exhaust ports formed separately in a position thereof substantially corresponding to said looped slit.

4. An ion source according to claim 3, wherein said permanent magnet is disposed substantially in the center of the interior of said box-type structure.

5. An ion source according to claim 1, wherein said permanent magnet is a cobalt-samarium based magnet.

6. An ion source according to claim 1, wherein said looped slits and permanent magnets are two or more in number.

7. An ion source according to claim 1, wherein said looped slit is a circular looped slit.

8. An ion source according to claim 1, wherein said looped slit is a rectangular looped slit.

9. An ion etching process, comprising steps of introducing a gas into a vacuum container; applying a voltage between an anode and a cathode with a looped slit which are disposed opposite to each other in said vacuum container, so that an orthogonal electromagnetic field may be formed in the vicinity of said looped slit as a combination of an electric field created by said impression of the voltage and a magnetic field created by a permanent magnet which is disposed in a position corresponding to a portion of said cathode that is surrounded by said looped slit; generating gas plasma from said gas by means of said orthogonal electromagnetic field; taking out positive ions in said gas plasma through said looped slit; and applying said extracted positive ions to a workpiece to be etched.

* * * * *